(12) United States Patent
Nishina et al.

(10) Patent No.: US 9,069,238 B2
(45) Date of Patent: *Jun. 30, 2015

(54) IMAGE DISPLAYING APPARATUS

(71) Applicant: Ricoh Company, Ltd., Tokyo (JP)

(72) Inventors: Kiichiro Nishina, Kanagawa (JP);
Makoto Hirakawa, Kanagawa (JP);
Hibiki Tatsuno, Kanagawa (JP);
Yasuyuki Shibayama, Kanagawa (JP);
Takanobu Osaka, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 150 days.

This patent is subject to a terminal disclaimer.

(21) Appl. No.: 13/665,503

(22) Filed: Oct. 31, 2012

(65) Prior Publication Data

US 2013/0107234 A1    May 2, 2013

(30) Foreign Application Priority Data

Oct. 31, 2011   (JP) .................................. 2011-238812

(51) Int. Cl.
   *G03B 21/28*     (2006.01)
   *G03F 7/20*      (2006.01)
   *G02B 17/08*     (2006.01)

(52) U.S. Cl.
   CPC ............. *G03B 21/28* (2013.01); *G03F 7/70225* (2013.01); *G02B 17/0848* (2013.01); *G02B 17/08* (2013.01)

(58) Field of Classification Search
   CPC ........... G02B 17/0848; G02B 17/0852; G02B 17/0816; G02B 17/08; G02B 17/0892; G03B 21/28; G03F 7/70225
   USPC ............ 353/30, 33, 37, 38, 99; 359/196, 364, 359/365, 379, 380, 507, 512, 668, 676, 359/820; 348/743–747; 349/5, 7–9
   See application file for complete search history.

(56) References Cited

U.S. PATENT DOCUMENTS 5,379,080 A * 1/1995 Onozuka ......................... 353/37
6,757,051 B2 * 6/2004 Takahashi et al. .............. 355/67

(Continued)

FOREIGN PATENT DOCUMENTS

JP    2004-258620     9/2004
JP    3727543         12/2005

(Continued)

OTHER PUBLICATIONS

U.S. Appl. No. 13/664,830, filed Oct. 31, 2012, Hirakawa, et al.

(Continued)

*Primary Examiner* — Sultan Chowdhury
(74) *Attorney, Agent, or Firm* — Oblon, McClelland, Maier & Neustadt, L.L.P.

(57) ABSTRACT

Disclosed is an image displaying apparatus including an image displaying element configured to form an image to be projected and a projection optical system having a positive refractive power and configured to project the image to be projected onto a screen, wherein the projection optical system includes a lens optical system and a mirror optical system, the lens optical system including plural lens groups, the mirror optical system including a first mirror and a second mirror, the second mirror being a concave mirror, wherein an intermediate image of a pixel of the image displaying element is formed between the image displaying element and the second mirror, and wherein the first mirror is held to be capable of adjusting a position thereof.

17 Claims, 9 Drawing Sheets

(56) References Cited

U.S. PATENT DOCUMENTS

| | | |
|---|---|---|
| 7,561,336 B2 | 7/2009 | Osaka et al. |
| 7,753,531 B2 | 7/2010 | Fujita et al. |
| 7,857,458 B2 | 12/2010 | Fujita et al. |
| 2001/0050758 A1 | 12/2001 | Suzuki et al. |
| 2003/0222980 A1 | 12/2003 | Miyagaki et al. |
| 2004/0051852 A1* | 3/2004 | Komatsuda ............... 353/99 |
| 2004/0184160 A1 | 9/2004 | Nishina et al. |
| 2005/0111072 A1 | 5/2005 | Miyagaki et al. |
| 2005/0185288 A1 | 8/2005 | Nishina et al. |
| 2005/0195492 A1 | 9/2005 | Nishina et al. |
| 2005/0195493 A1 | 9/2005 | Nishina et al. |
| 2006/0039068 A1 | 2/2006 | Tokita et al. |
| 2006/0098172 A1* | 5/2006 | Goto et al. ............... 353/98 |
| 2006/0192903 A1 | 8/2006 | Takaura et al. |
| 2006/0227303 A1* | 10/2006 | Matsubara et al. ........... 353/99 |
| 2007/0008495 A1 | 1/2007 | Miyagaki et al. |
| 2008/0068563 A1 | 3/2008 | Abe et al. |
| 2008/0068564 A1 | 3/2008 | Abe et al. |
| 2008/0192336 A1 | 8/2008 | Ohzawa |
| 2009/0021703 A1* | 1/2009 | Takaura et al. ............... 353/99 |
| 2009/0066919 A1 | 3/2009 | Fujita et al. |
| 2009/0153809 A1 | 6/2009 | Amano et al. |
| 2009/0168031 A1 | 7/2009 | Imaoka et al. |
| 2009/0213470 A1 | 8/2009 | Abe et al. |
| 2010/0039625 A1 | 2/2010 | Takaura et al. |
| 2010/0053737 A1 | 3/2010 | Fujita et al. |
| 2010/0157421 A1 | 6/2010 | Abe et al. |
| 2010/0195061 A1 | 8/2010 | Takaura et al. |
| 2011/0242506 A1* | 10/2011 | Uchiyama et al. ............ 353/98 |
| 2012/0019791 A1 | 1/2012 | Abe et al. |
| 2012/0092628 A1 | 4/2012 | Takahashi et al. |
| 2012/0154768 A1 | 6/2012 | Tatsuno |
| 2012/0162753 A1 | 6/2012 | Tatsuno |
| 2012/0236266 A1 | 9/2012 | Takahashi et al. |

FOREIGN PATENT DOCUMENTS

| | | |
|---|---|---|
| JP | 2007-212748 | 8/2007 |
| JP | 2008-096983 | 4/2008 |
| JP | 2008-096984 | 4/2008 |
| JP | 2008-165187 | 7/2008 |
| JP | 2008-165202 | 7/2008 |
| JP | 2008-181152 | 8/2008 |
| JP | 2008-268978 | 11/2008 |
| JP | 2009-008931 | 1/2009 |
| JP | 4210314 | 1/2009 |
| JP | 2009-080462 | 4/2009 |
| JP | 2009-086315 | 4/2009 |
| JP | 2009-145672 | 7/2009 |
| JP | 2009-157223 | 7/2009 |
| JP | 2009-204846 | 9/2009 |
| JP | 4329863 | 9/2009 |
| JP | 2009-222806 | 10/2009 |
| JP | 2010-020344 | 1/2010 |
| JP | 2010-044430 | 2/2010 |
| JP | 2010-085973 | 4/2010 |
| JP | 2010-197495 | 9/2010 |
| JP | 2010-197837 | 9/2010 |
| JP | 2010-197874 | 9/2010 |
| JP | 2010-204486 | 9/2010 |
| JP | 2011-059459 | 3/2011 |
| JP | 2011-100008 | 5/2011 |
| JP | 2011-107295 | 6/2011 |
| JP | 2011-112811 | 6/2011 |
| JP | 2011-112862 | 6/2011 |
| JP | 2011-112864 | 6/2011 |
| JP | 2011-150355 | 8/2011 |
| JP | 2011-164140 | 8/2011 |
| JP | 2011-175092 | 9/2011 |
| JP | 2011-180384 | 9/2011 |
| JP | 2011-232416 | 11/2011 |
| JP | 2011-242606 | 12/2011 |
| JP | 2012-008284 | 1/2012 |
| JP | 2012-027113 | 2/2012 |
| JP | 2012-083671 | 4/2012 |
| JP | 2012-118124 | 6/2012 |
| JP | 2012-124547 | 6/2012 |
| JP | 2012-155203 | 8/2012 |
| JP | 2012-163732 | 8/2012 |
| JP | 2012-168482 | 9/2012 |
| JP | 2012-209927 | 10/2012 |

OTHER PUBLICATIONS

U.S. Appl. No. 13/665,427, filed Oct. 31, 2012, Nishina, et al.
U.S. Appl. No. 13/667,221, filed Nov. 2, 2012, Osaka, et al.
U.S. Appl. No. 13/669,079, filed Nov. 5, 2012, Tatsuno, et al.
U.S. Appl. No. 13/669,159, filed Nov. 5, 2012, Tatsuno, et al.

* cited by examiner

IMAGE DISPLAYING APPARATUS

BACKGROUND OF THE INVENTION

1. Field of the Invention

An aspect of the present invention may relate to at least an image displaying apparatus.

2. Description of the Related Art

An image displaying apparatus is known which may be capable of displaying an enlarged image even if placement thereof is conducted nearer to a screen than a conventional one. Such an image displaying apparatus is called a "short distance projector". An object(s) of a short distance projector is/are as follows. There are provided, first, to avoid glare provided by projection light entering the eyes of a presenter (an expositor or speaker, etc.) standing near a screen, and second, to prevent an audience listening to an explanation of a presenter from being affected by exhaust air or noise from a projector.

Plural types of a projection optical system included in a short distance projector have been known. For example, there are provided a type being capable of extending an angle of view of a conventional (coaxial or rotationally symmetric) projection optical system to reduce a distance thereof from a screen surface, and a type using a curved mirror, etc. It may be possible for a type extending an angle of view of a conventional projection optical system to achieve a short distance projection as an extension of a conventional technique. However, it may be necessary to provide a lens with a large outer diameter near a screen, and hence, a projector may be entirely large.

On the other hand, it may be possible for a type using a curved mirror to provide a compact projection optical system and to achieve projection at a short distance. An example of a projector including a projection optical system using a curved mirror is described in Japanese Patent No. 4329863 or Japanese Patent No. 3727543. For a projection optical system included in a projector in Japanese Patent No. 4329863, a concave mirror is arranged behind a lens optical system. For a projection optical system included in a projector described in Japanese Patent No. 3727543, a convex mirror is arranged behind a lens optical system. In any thereof, it may be possible to conduct setting by merely arranging a lens(es) and a mirror(s) in order, and hence, it may be possible to increase a precision of arrangement of parts. However, it may be necessary to provide a long distance between a lens optical system and a mirror, and hence, a large projection optical system may be provided.

An invention in which it may be possible to reduce a distance between a lens and a mirror, is described in, for example, Japanese Patent Application Publication No. 2009-157223 or Japanese Patent Application Publication No. 2009-145672. Inventions described in Japanese Patent Application Publication No. 2009-157223 and Japanese Patent Application Publication No. 2009-145672 are to arrange a folding mirror to fold a long distance between a lens optical system and a mirror wherein miniaturization of an optical system is intended.

An invention described in Japanese Patent Application Publication No. 2009-157223 is to arrange a concave mirror and a convex mirror in order next to a lens optical system wherein miniaturization thereof is intended. Furthermore, an invention described in Japanese Patent Application Publication No. 2009-145672 is to arrange a plane mirror behind a concave mirror wherein miniaturization thereof is intended.

However, a distance from an image displaying element to a curved mirror is long in an optical system described in any of Japanese Patent Application Publication No. 2009-157223 and Japanese Patent Application Publication No. 2009-145672. Accordingly, a length of an optical system body may interfere in reducing a distance from a screen to a projector body further than a conventional one.

In order to solve such a constraint for "a size of an optical system itself", an invention described in Japanese Patent No. 4210314 is provided. A projection optical system in which a screen surface and a display surface of an image displaying element are perpendicular to each other is described in Japanese Patent No. 4210314. As such a vertical type is adopted, a length of a projection optical system itself may not provide an interference even if a distance between a screen and a projector body is reduced.

As a vertical type projection optical system such as a projection optical system described in Japanese Patent No. 4210314 is used, it may be necessary to increase a divergence of light incident on a mirror optical system from a lens optical system to project a large format image at an ultra-short throw.

However, as a divergence thereof is increased, a refraction angle of a light ray may be large, and hence, an influence on a quality of a projected image due to a positional displacement of a lens optical system or mirror optical system may be large which may cause degradation of an image quality. In particular, as a position of a lens optical system or a second mirror (a mirror closest to a screen on an optical path) is displaced, a field curvature may vary greatly to provide a factor of a drastic degradation of an image quality.

SUMMARY OF THE INVENTION

According to an aspect of the present invention, there may be provided an image displaying apparatus including an image displaying element configured to form an image to be projected and a projection optical system having a positive refractive power and configured to project the image to be projected onto a screen, wherein the projection optical system includes a lens optical system and a mirror optical system, the lens optical system including plural lens groups, the mirror optical system including a first mirror and a second mirror, the second mirror being a concave mirror, wherein an intermediate image of a pixel of the image displaying element is formed between the image displaying element and the second mirror, and wherein the first mirror is held to be capable of adjusting a position thereof.

BRIEF DESCRIPTION OF THE DRAWINGS

FIG. 3 is a schematic diagram illustrating an example of an essential part of a projection optical system included in the example of an image displaying apparatus and a surface to be projected to.

DETAILED DESCRIPTION OF THE PREFERRED EMBODIMENTS

Figure 1:
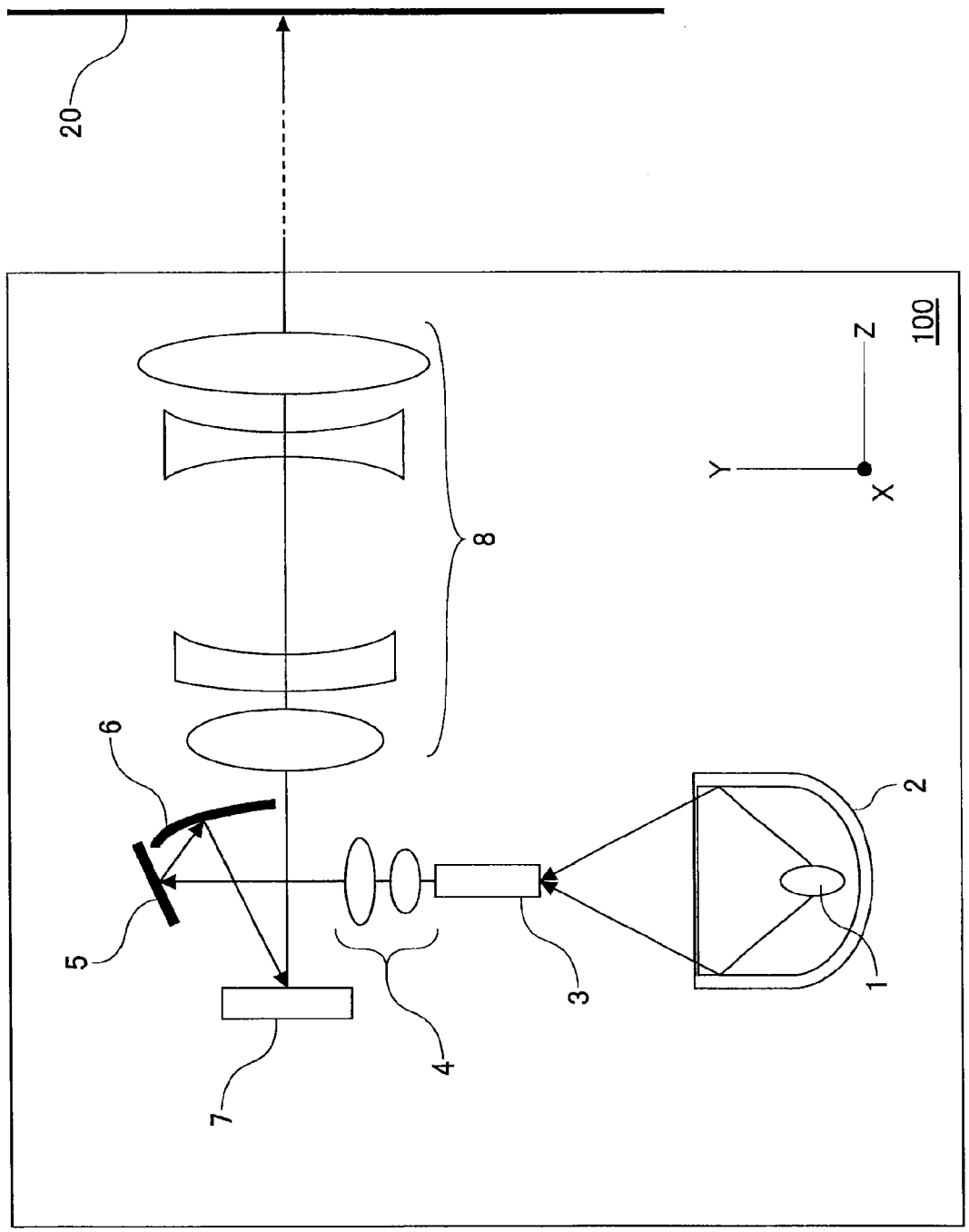
FIG. 1 is an optical arrangement diagram which generally illustrates an example of an image displaying apparatus according to an embodiment of the present invention.

A practical example of an image displaying apparatus according to an embodiment of the present invention will be described by using the drawings below. FIG. 1 is a side view of a an essential part of an optical engine included in a projector 100 being an image displaying apparatus according to the present practical example when viewed from one direction.

In FIG. 1, the projector 100 generally includes an illumination optical system for illuminating a DMD 7 which is a reflective image displaying element with light emitted from a lamp 1 which is a light source, and a projection optical system for projecting light reflected from the DMD 7 toward a screen 20 which is a surface to be projected to. FIG. 1 illustrates only a lens optical system 8 which is a part of a projection optical system. In the present specification, an axis in a direction of an optical axis of a projection optical system is a Z-axis and an axis in a direction of an optical axis of an illumination optical system is a Y-axis, while an axis in a direction orthogonal to both a Z-axis and a Y-axis is an X-axis.

Additionally, in a practical example which will be described below, a DMD which is a reflective image displaying element is used as an example of an image displaying element. However, an element used as an image displaying element included in an image displaying apparatus according to an embodiment of the present invention is not limited to a DMD but instead another image displaying element, for example, a liquid crystal panel, may be used.

An illumination optical system included in the projector 100 will be described below. Light emitted from a lamp 1 which is a light source is condensed onto an entrance port of an integrator rod 3 by a reflector 2. The integrator rod 3 is a light pipe with a tunnel-like shape provided by combining four mirrors. Light incident on the integrator rod 3 is repeatedly reflected by mirror surfaces constituting an inner wall of the integrator rod 3. Thereby, Light incident on the integrator rod 3 emerges from an exit port as light with a uniform light quantity and no irregularity.

While an exit port of the integrator rod 3 is regarded as a surface light source with a uniform light quantity and no irregularity, light from such a surface light source illuminates an effective image area of the DMD 7 which is an image displaying element, via a lens for DMD illumination 4, a first folding mirror 5, and a second folding mirror 6. The lens for DMD illumination 4 is an optical element for efficiently illuminating an effective image area of the DMD 7. The first folding mirror 5 is a plane mirror and the second folding mirror 6 is a free-form surface mirror (concave mirror).

Light emitted from a surface light source which is an exit port of the integrator rod 3 passes through the lens for DMD illumination 4, is reflected by the first folding mirror 5 toward an obliquely lower right direction in FIG. 1, and is directed toward the second folding mirror 6. Light as described above is reflected by the second mirror toward a surface of the DMD 7 to illuminate a surface of the DMD 7. A Micro-mirror(s) is/are arranged on a surface of the DMD 7. Illumination light is reflected by such a micro-mirror(s) to form image projection light. Such image projection light passes through a side of the second folding mirror 6, enters the lens optical system 8 which constitutes a projection optical system, and is projected toward the screen 20. The lamp 1 through the second folding mirror 6 will be referred to as an "illumination optical system".

By an illumination optical system as described above, the DMD 7 is illuminated with light with no light quantity irregularity to provide a uniform illuminance distribution. Hence, a projection image which is projected onto and displayed on the screen 20 also provides a uniform illuminance distribution.

The DMD 7 is a device composed of multiple micro-mirrors and it may be possible to change an angle of each micro-mirror within a range of +12° to −12°. For example, when an angle of a micro-mirror is −12°, illumination light reflected by such a micro-mirror is provided to enter a projection lens. Such a state will be referred to as an "on-state". Furthermore, when an angle of a mirror is +12°, illumination light reflected by such a micro-mirror is provided not to enter a projection lens. Such a state will be referred to as an "off-state".

A micro-mirror of the DMD 7 corresponds to a pixel of an image displayed on a surface to be projected to. Hence, a tilt angle of each micro-mirror of the DMD 7 is controlled to conduct an "on" or "off" control for each pixel whereby it may be possible to produce projection light necessary for forming an image to be displayed on the screen 20 (projection image light) and to display an image on the screen 20 via a projection optical system.

FIG. 1 illustrates only the lens optical system 8 for a projection optical system, wherein a mirror optical system included in the projection optical system is omitted therein. The lens optical system 8 includes a projection lens composed of plural lenses and a lens barrel for holding such a projection lens. In FIG. 1, a lens barrel is omitted. Furthermore, a mirror optical system which is not illustrated includes a mirror for reflecting a projection light beam from a projection lens toward a screen 20.

Figure 2:
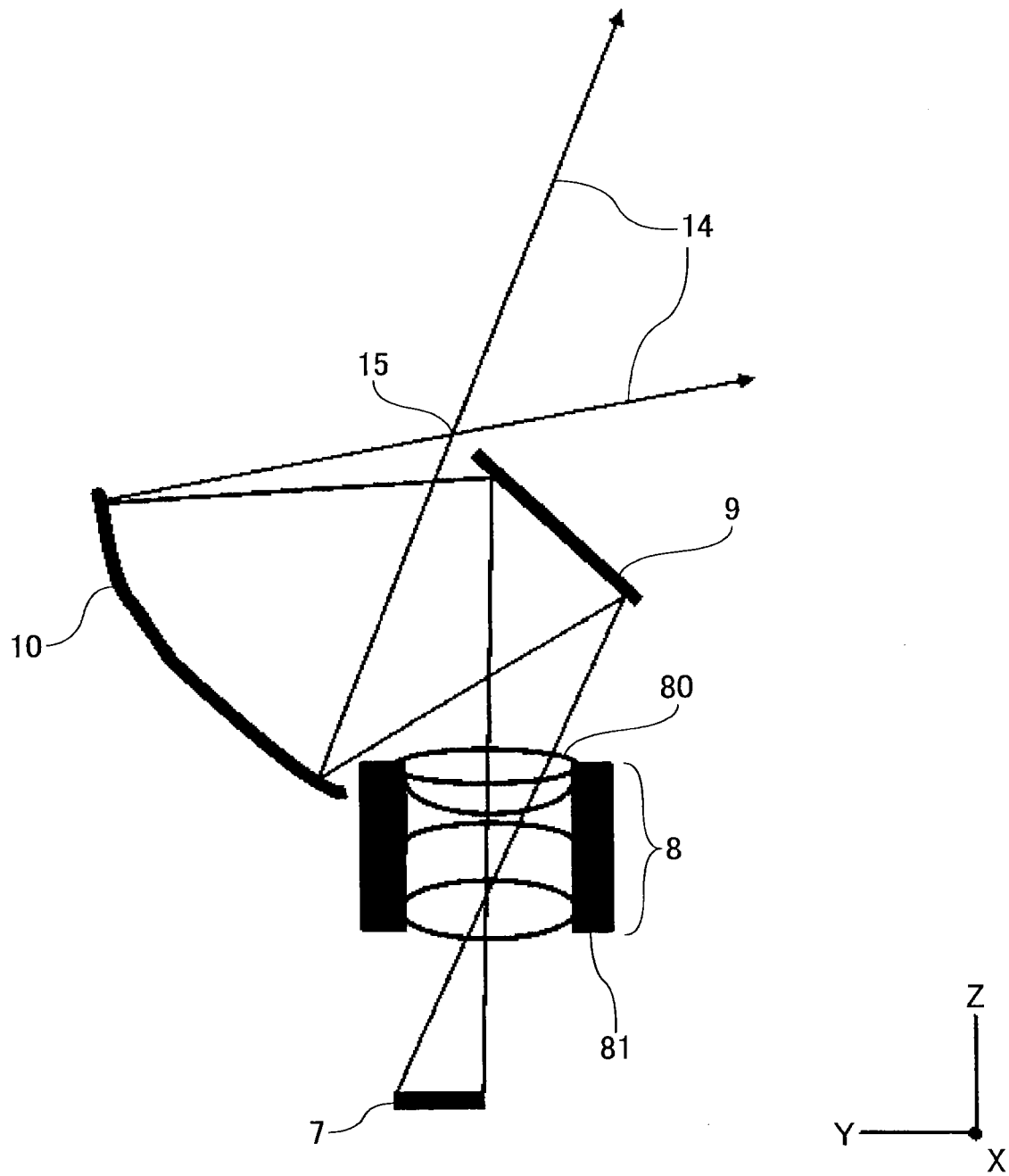
FIG. 2 is an enlarged schematic diagram of an example of an essential part of a projection optical system included in the example of an image displaying apparatus.

Next, a practical example of a projection optical system included in an image displaying apparatus according to an embodiment of the present invention will be described. FIG. 2 is a schematic diagram of an enlarged essential part of a projection optical system in the present practical example. In FIG. 2, a lens optical system 8 and a mirror optical system are illustrated while illustration of an illumination optical system is omitted. FIG. 2 illustrates a condition that all of the micromirrors included in a DMD 7 are provided in an on-state, wherein an effective image area is entirely projected onto a screen 20 which is a surface to be projected to.

In FIG. 2, a projection light beam 14 is represented by two rays which enter a lens optical system 8 from an edge portion of an effective image area of the DMD 7, then pass through a first mirror 9 and second mirror 10 constituting a mirror optical system, and arrive at the screen 20.

The lens optical system 8 is composed of plural lenses contained in a lens barrel 81. The projection light beam 14 converges inside the lens barrel 81 and subsequently diverges to be directed to the first mirror 9. A condition that it may be possible to project a large format image even if the screen 20 and a projector 100 are at a short distance is that light directed from the lens optical system 8 to the first mirror 9 is provided as a light beam with a large divergence as illustrated in FIG. 2. Furthermore, a condition that it may be possible to conduct projection of a large format image even at a short distance is that light reflected from the second mirror 10 converges at a position which is far closer to the second mirror 10 than the screen 20, and subsequently diverges and is projected onto the screen 20.

Figure 3:
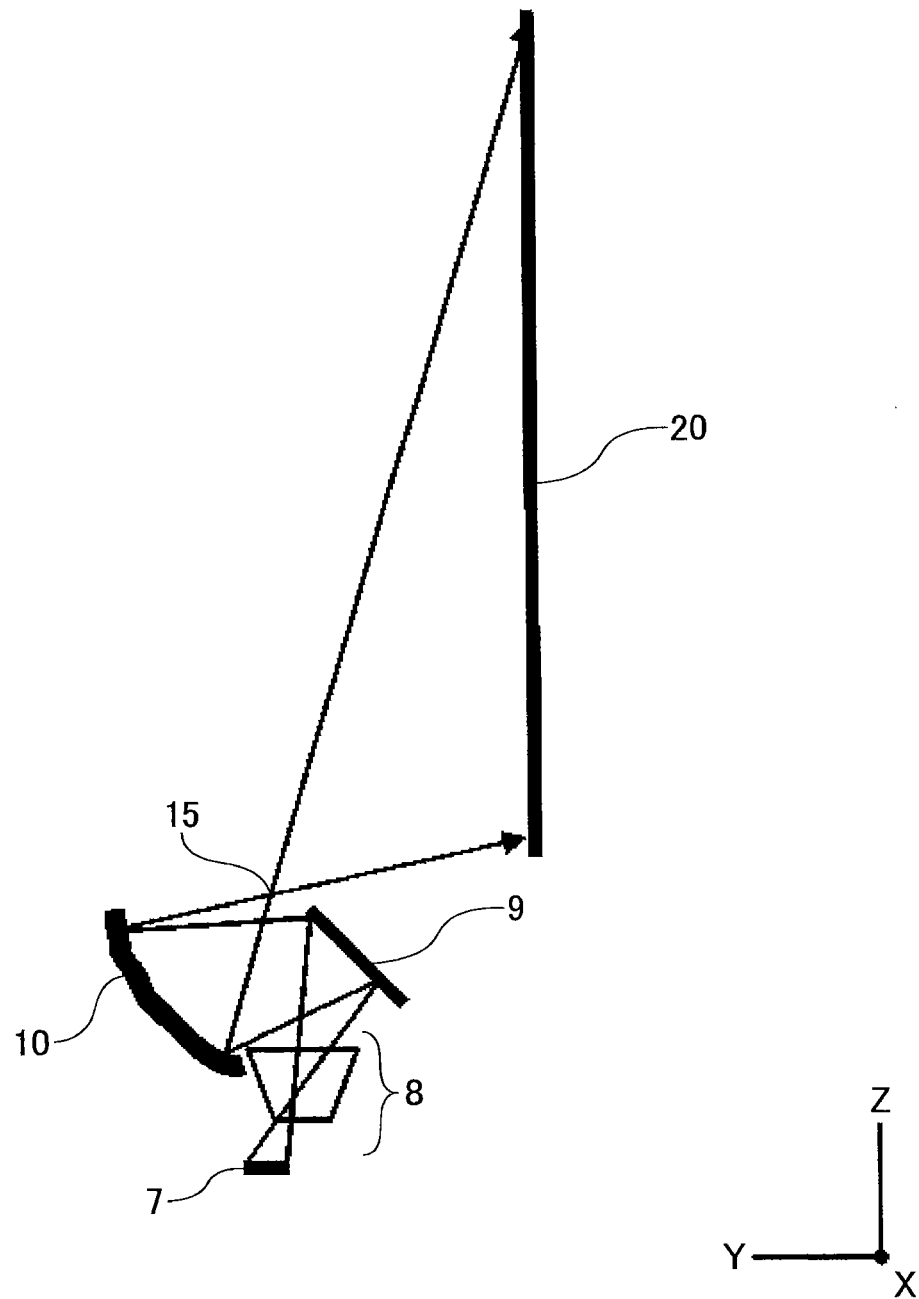

FIG. 3 is a schematic diagram including an essential part of a projection optical system according to the present practical example and a screen which is a surface to be projected to. In FIG. 3, a lens optical system 8, a mirror optical system, and a screen 20 are illustrated while illustration of an illumination optical system is omitted. As illustrated in FIG. 3, an intersecting angle of a plane provided by extending a reflection surface of a DMD 7 in a direction of a Y-axis and a plane provided by extending the screen 20 in a direction of a Z-axis is generally or approximately a right angle. That is, an angle of the DMD 7 with respect to the screen 20 is generally or approximately a right angle. A configuration of a projector 100 in which the DMD 7 which is an image displaying element and the screen 20 which is a surface to be projected to have a relationship as described above is referred to as a "vertical type projector".

It may be possible for the projector 100 which is a vertical type projector to achieve an ultra-short throw, because a length of a projection optical system itself may not provide a limitation on a distance between the screen 20 and the projector 100.

The lens optical system 8 and a second mirror 10 in the projector 100 may have a possibility of causing a large dispersion in a positional relationship thereof. If a large dispersion is caused in a positional relationship between the lens optical system 8 and the second mirror 10, a quality of an image displayed on the screen 20 may be degraded. Hence, the projector 100 according to the present practical example includes a position adjusting part capable of adjusting a positional relationship between a lens optical system and a mirror optical system.

Figure 4:
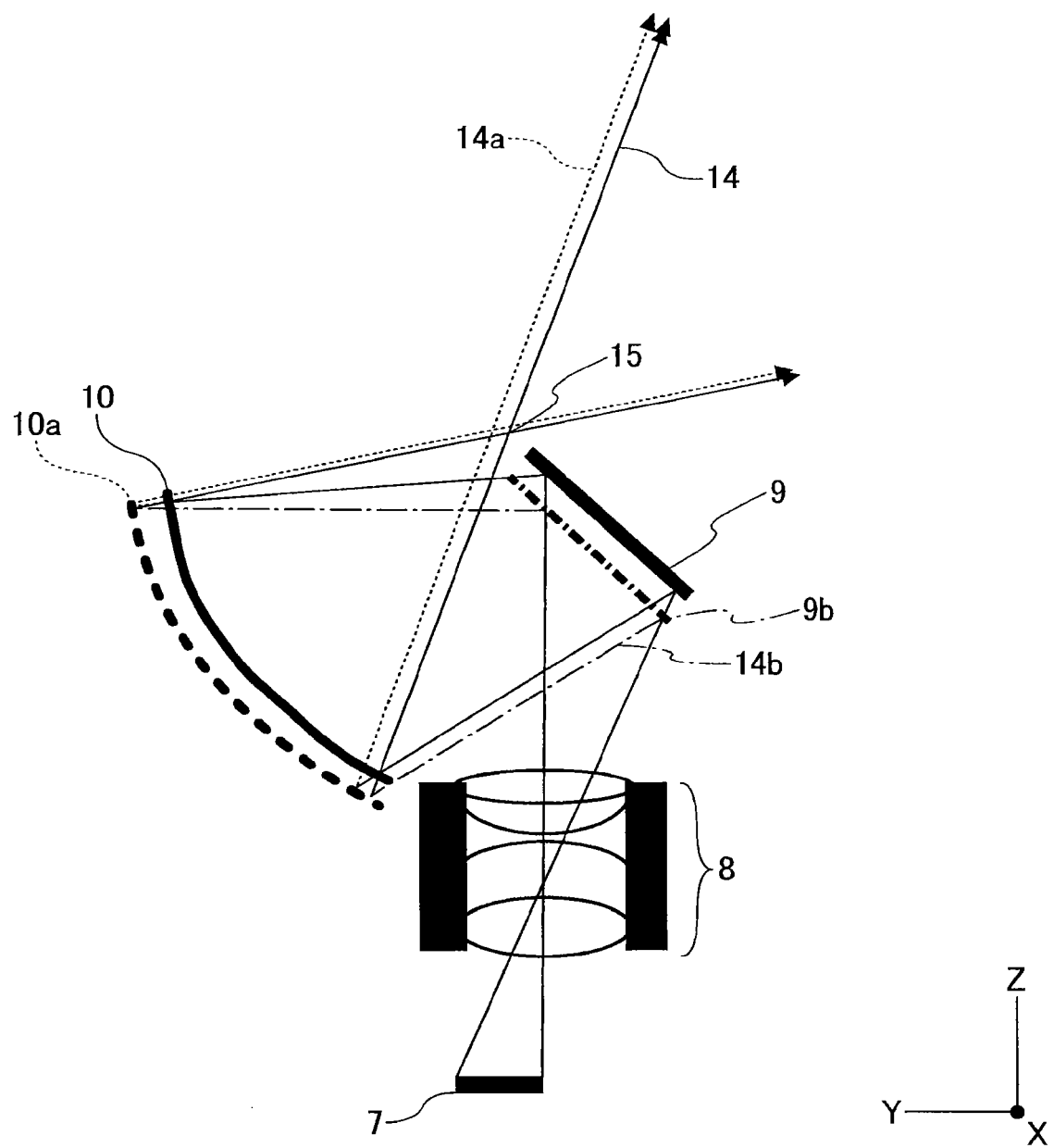
FIG. 4 is an enlarged schematic diagram of an example of an essential part of a projection optical system included in the example of an image displaying apparatus.

Herein, what is a condition that "there is a dispersion" in a positional relationship among a lens optical system 8 and a first mirror 9 and second mirror 10 constituting a mirror optical system will be described by using FIG. 4. As illustrated in FIG. 4, a "dispersion" refers to a position of the second mirror 10 displaced from an optimum position with respect to the lens optical system 8 to a traveling direction of a light beam. In FIG. 4, a second mirror 10*a* illustrates an example of a position displaced from that of the second mirror provided at a normal position.

If a projection light beam 14 reflected from the first mirror 9 placed to correspond to the second mirror 10 at a normal position impinges on the second mirror 10*a* displaced at a position different from a normal position (or having a dispersion therein), a projection light beam 14*a* composed of light reflected therefrom may be directed to a screen through an optical path different from that in a case where the second mirror 10 is present at a normal position. Thereby, a position of an image projected on a screen which is not illustrated in the figure may be displaced or an image quality may be degraded.

In order to adjust a dispersion of such an optical path, the first mirror 9 is held by a position adjusting part in a projector 100 according to the present practical example. For example, the first mirror 9 is translated in a traveling direction of a light beam (or a direction of a normal line of a reflection surface of the first mirror 9) by a position adjusting part, whereby it may be possible to provide arrangement thereof at a position (symbol 9*b*) suited for the second mirror 10*a*.

If a dispersion is caused in a positional relationship between the lens optical system 8 and the second mirror 10, the first mirror 9 is moved to a position denoted by symbol 9*b* so that a light beam reflected from a first mirror 9*b* runs on an optical path denoted by symbol 14*b*. When a projection light beam 14*b* is reflected by a second mirror 10*a*, it returns to an optical path identical to a projection optical path 14 which is an optical path at a normal position is conducted. Thus, a dispersion caused in a position of the second mirror 10 may be canceled by a position adjusting part which holds the first mirror 9, whereby it may be possible to prevent degradation of a quality of an image displayed on a screen.

Figure 5A:
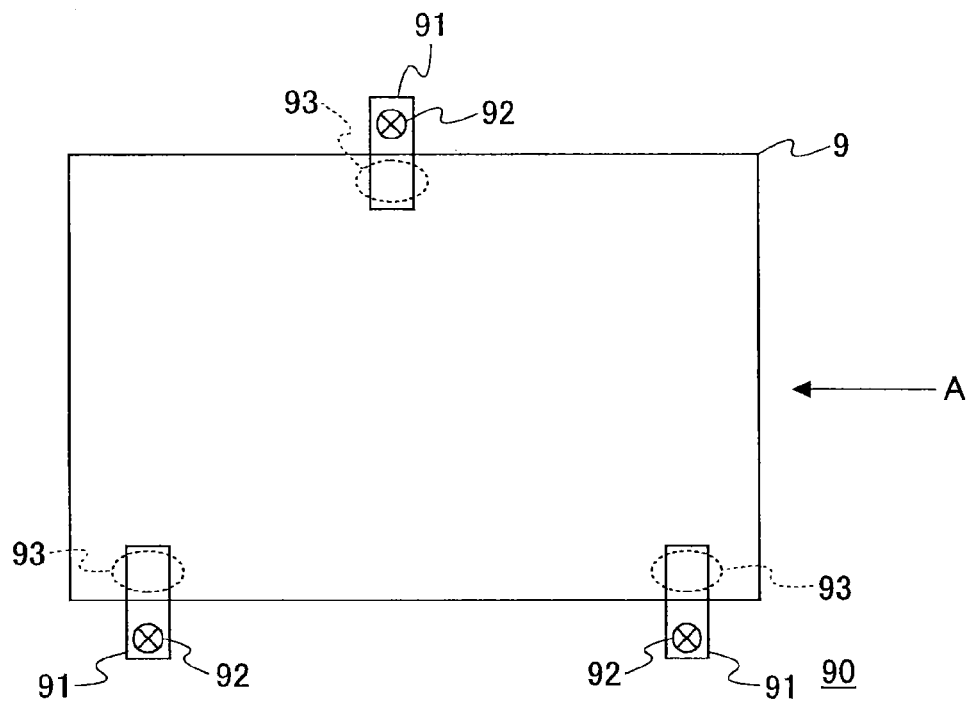
FIG. 5A and FIG. 5B are an elevation view and right side view illustrating an example of a first mirror position adjusting part included in the projection optical system, respectively.
Figure 5B:
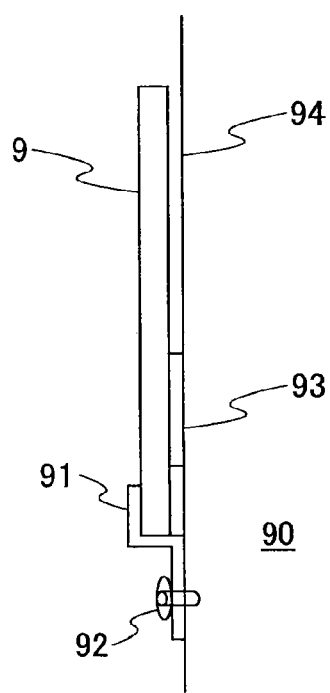

Next, an embodiment of a position adjusting part for a first mirror 9 will be described by using FIG. 5A and FIG. 5B. FIG. 5A is an example of an elevation view of the first mirror 9 when viewed from a side of a reflection surface thereof. FIG. 5B is an example of a right side view of the first mirror 9 when viewed from a direction of an arrow denoted by symbol A in FIG. 5A. In FIG. 5A and FIG. 5B, the first mirror 9 is a plane mirror whose outline is a rectangle.

A position adjusting part 90 is composed of fixation members 91, screws 92, and spacers 93. The first mirror 9 is supported at three points by fixation members 91 positioned near a center of one long side and near both ends of another long side, so as to be fixed at a predetermined position on a back supporting part 94. That is, the first mirror 9 is held at a predetermined position by the position adjusting part 90.

The fixation member 91 is a member made of an elastic material for applying a pressure for pressing the first mirror 9 against a back side, wherein one end thereof is fixed on the back supporting part 94 for supporting a back side of the first mirror 9, by the screw 92 which is a fastening member. Another end of the fixation member 91 engages a front side (or mirror surface side) of the first mirror 9 to support the first mirror 9 at a predetermined position and at a predetermined attitude. The back supporting part 94 is composed of a part of a housing of an image displaying apparatus or a mirror holder, etc.

Each of the spacers 93 is interposed and held between the first mirror 9 and the back supporting part 94. Each spacer 93 is inserted into and arranged at a location at which the fixation member 91 presses the first mirror 9 against a side of the back supporting part 94. Such a spacer 93 forms an air gap between the first mirror 9 and the back supporting part 94, whereby a frictional force which may be caused between a back side of the first mirror 9 and the back supporting part 94 may be reduced and it may be possible to move the first mirror 9 in a direction on a plane thereof.

When thickness dimensions (or thickness) of the spacers 93 are all identical to one another, it may be possible to translate the first mirror 9 in a direction perpendicular to a reflection surface thereof to adjust a position thereof. Furthermore, when thickness dimensions of the spacers 93 are different from one another, it may also be possible to change and adjust a tilt of a reflection surface of the first mirror 9 with respect to a second mirror 10.

Thus, due to the position adjusting part 90 provided for the first mirror 9 in a projector 100 according to the present practical example, it may be possible to adjust thickness dimensions of the spacers 93 so as to adjust a position and/or tilt of the first mirror 9 arbitrarily, whereby it may be possible to provide improvement of an image quality even if a dispersion is caused in a positional relationship between a lens optical system 8 and the second mirror 10.

Figure 6A:
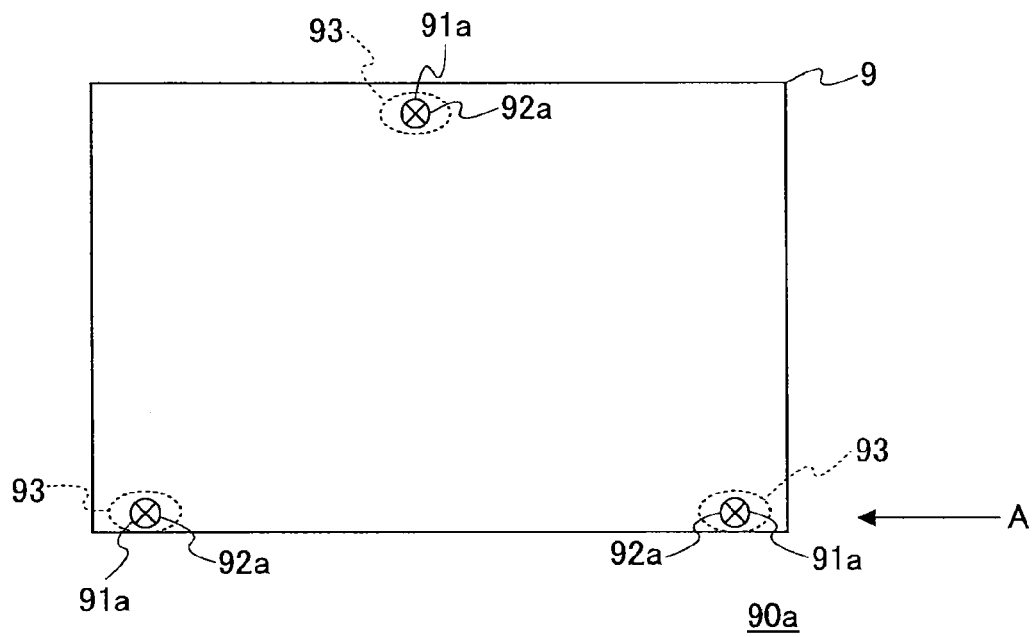
FIG. 6A and FIG. 6B are a plan view and right side view illustrating another example of a first mirror position adjusting part included in the projection optical system, respectively.
Figure 6B:
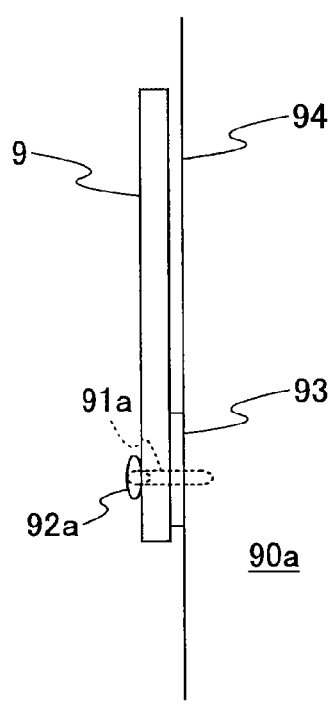

Next, another embodiment of a position adjusting part 90 for a first mirror 9 will be described by using FIG. 6A and FIG. 6B. FIG. 6A is an example of an elevation view of the first mirror 9 when viewed from a side of a reflection surface thereof. FIG. 6B is an example of a right side view of the first mirror 9 when viewed from a direction of an arrow denoted by symbol A in FIG. 6A. As illustrated in FIG. 6A and FIG. 6B, a position adjusting part 90a for the first mirror 9 is to be inserted into and penetrate through screw holes 91a preformed on the first mirror 9 screws 92a and to conduct fixation on a back supporting part 94 together with spacers 93, without using a fixation member 91 (see FIG. 5A and FIG. 5B). A thickness dimension of each spacer 93 is adjusted separately whereby it may be possible to adjust a tilt of the first mirror 9. Furthermore, a hole formed on the spacer 93 may be provided to have a size larger than a diameter dimension of the screw 92a whereby it may be possible to slide the first mirror 9 parallel to a direction on a mirror surface thereof with respect to the back supporting part 94 to adjust a position thereof, and it may also be possible to adjust a tilt thereof as described above.

Thus, due to the position adjusting part 90a provided for the first mirror 9 in a projector 100 according to the present practical example, it may be possible to adjust a thickness dimension of the spacer 93 so as to adjust a position and/or tilt of the first mirror 9 arbitrarily, whereby it may be possible to provide improvement of an image quality even if a dispersion may be caused in a positional relationship between a lens optical system 8 and a second mirror 10.

Figure 7:
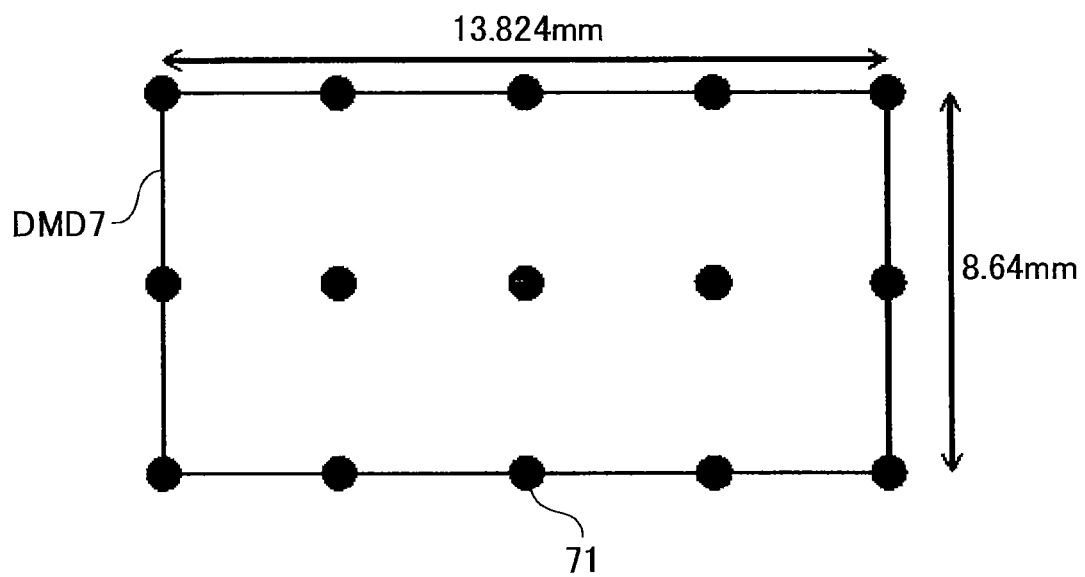
FIG. 7 is a plan view illustrating an example of a reflective image displaying device included in the image displaying apparatus.
Figure 7:
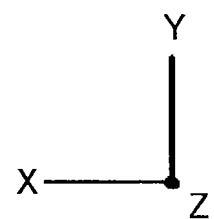
Figure 8:
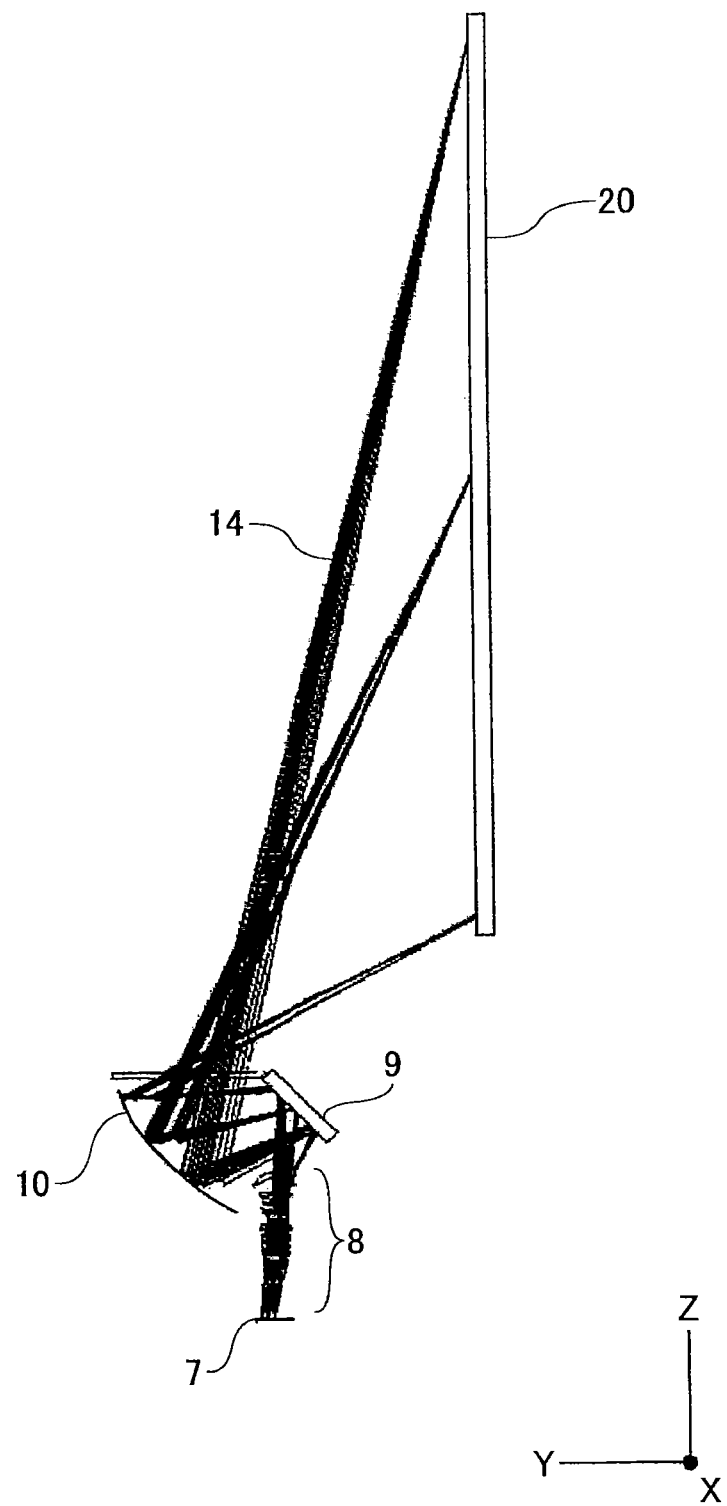
FIG. 8 is a light ray diagram illustrating a trajectory of light to be projected by the projection optical system.

Next, a projection optical system included in an image displaying apparatus according to an embodiment of the present invention will be described. FIG. 7 is a plane view of a DMD 7. In FIG. 7, among plural points on a plane of the DMD 7, a point 71 which is a middle point in a direction of an X-axis and a bottom point in a direction of a Y-axis is decentered in the direction of a Y-axis. An amount of decentering thereof is 1.56 mm. FIG. 8 is a light ray trace diagram in a case where seven light rays are emitted from each of fifteen points on a DMD 7 as illustrated in FIG. 7.

If a projection light beam 14 emitted from the DMD 7 is not folded by a first mirror 9 and a projection light beam 14 having passed through a lens optical system 8 is reflected by a second mirror 10 and projected onto a screen like a conventionally known projection optical system, an external packaging part of a body may have a shape protruding toward a screen side, for arrangement of a projection optical system. Accordingly, it may not be possible to conduct placement thereof unless a distance between a projector and a screen is larger than a length of an image displaying apparatus according to an embodiment of the present invention. That is, a configuration provided in such a manner that a projection light beam 14 having a large divergence is directed to and projected onto a screen 20 by a first mirror 9 and a second mirror 10 like a projector 100 illustrated in the practical example may be capable of conducting projection at an ultrashort distance which could not be attained by a conventional one.

Figure 9:
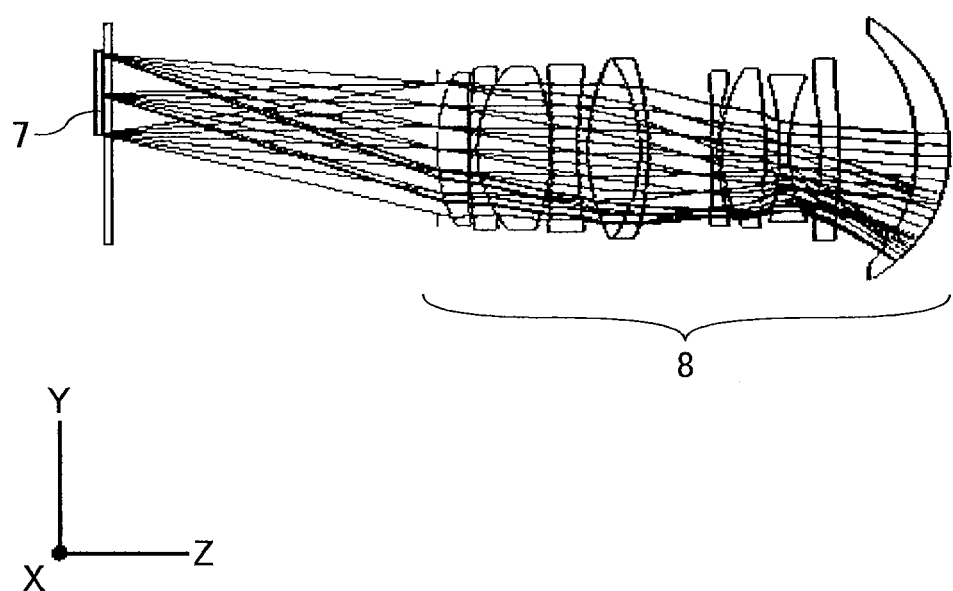
FIG. 9 is a side view illustrating an example of a lens optical system included in the image displaying apparatus.

FIG. 9 illustrates an example of a configuration of a lens optical system 8. In FIG. 9, a direction of an optical axis of a lens is a Z-axis and two axes orthogonal thereto are an X-axis and a Y-axis. The lens optical system 8 illustrated in FIG. 9 is a coaxial optical system in which an optical axis of each lens is present on an identical straight line.

Such an optical axis and a bottom point 71 in a direction of a Y-axis among plural points present on a plane of a DMD 7 illustrated in FIG. 7 are decentered in a direction of a Y-axis and an amount of decentering thereof is 1.56 mm. That is, in FIG. 9, the optical axis is present by 1.56 mm below a bottom end of the DMD 7.

Next, a specific example of numerical values for a projection optical system will be presented. Table 1 illustrates a configuration of a coaxial optical system as described above. In Table 1, surface numbers 1 and 2 refer to both surfaces of a cover glass arranged at a front face side of a DMD 7. Subsequently, a stop is arranged, and further subsequently, lenses indicated by surface numbers 4 to 24 are arranged.

TABLE 1

| Surface number | Radius of curvature | Distance | Refractive index (d line) & Abbe number |
|---|---|---|---|
| 0 (DMD) | 1.0E+18 | 1.110 | |
| 1 | 1.0E+18 | 1.050 | 1.516798 |
| | | | 64.10 |
| 2 | 1.0E+18 | 37.511 | |
| 3 (stop) | 1.0E+18 | 0.000 | |
| 4 | 21.0616 | 3.589 | 1.517600 |
| | | | 63.5 |
| 5 | −1.3E+02 | 0.100 | |
| 6 | 60.9542 | 0.900 | 1.883000 |
| | | | 40.80 |
| 7 | 12.3278 | 8.525 | 1.487489 |
| | | | 70.44 |
| 8 | −21.7193 | 0.100 | |
| 9 | −80.7180 | 2.900 | 1.719013 |
| | | | 30.84 |
| 10 | 52.5721 | 1.192 | |
| 11 | 20.2544 | 6.018 | 1.581810 |
| | | | 41.17 |
| 12 | −16.4629 | 0.973 | 1.904000 |
| | | | 31.30 |
| 13 | −29.4138 | 7.280 | |
| 14 | 1.0E+18 | 0.000 | |
| 15 | −737.0756 | 0.900 | 1.502194 |
| | | | 68.83 |
| 16 | 24.0244 | 0.300 | |
| 17 | 15.2620 | 5.000 | 1.706797 |
| | | | 29.84 |
| 18 | −47.7023 | 1.745 | |
| 19 | −23.6586 | 1.100 | 1.904000 |
| | | | 31.30 |

TABLE 1-continued

| | | | |
|---|---|---|---|
| 20 | 15.5688 | 3.698 | |
| 21 | −20.2538 | 2.100 | 1.531590 |
| | | | 55.8 |
| 22 | −35.7110 | 8.680 | |
| 23 | −17.2048 | 3.763 | 1.531590 |
| | | | 55.8 |
| 24 | −14.6151 | 24.770 | |

| Surface number | Aperture radius | Decentering Y (LB end portion - optical axis) | Aspheric surface |
|---|---|---|---|
| 0 (DMD) | | 0 | |
| 1 | | 0 | |
| 2 | | 0 | |
| 3 (stop) | 7 | −1.560 | |
| 4 | | −1.560 | • |
| 5 | | −1.560 | • |
| 6 | | −1.560 | |
| 7 | | −1.560 | |
| 8 | | −1.560 | |
| 9 | | −1.560 | |
| 10 | | −1.560 | |
| 11 | | −1.560 | |
| 12 | | −1.560 | |
| 13 | | −1.560 | |
| 14 | | −1.560 | |
| 15 | 7.4 | −1.560 | |
| 16 | 7.4 | −1.560 | |
| 17 | 9.1 | −1.560 | |
| 18 | 9.1 | −1.560 | |
| 19 | | −1.560 | |
| 20 | | −1.560 | |
| 21 | | −1.560 | • |
| 22 | | −1.560 | • |
| 23 | | −1.560 | • |
| 24 | | −1.560 | • |

In Table 1, surfaces 4, 5, 21, 22, 23, and 24 are aspheric surfaces and aspheric surface coefficients thereof are presented in Table 2.

TABLE 2

| | Surface number | | |
|---|---|---|---|
| | 4 | 5 | 21 |
| 4th order coefficient (E4) | 7.416275E−05 | 8.857986E−05 | 1.252837E−04 |
| 6th order coefficient (E6) | 2.074740E−07 | 2.750710E−07 | 2.866321E−06 |
| 8th order coefficient (E8) | 5.274898E−09 | 2.760577E−09 | −1.166681E−07 |
| 10th order coefficient (E10) | −1.666298E−11 | 4.115343E−11 | 2.492616E−09 |
| 12th order coefficient (E12) | −1.657250E−13 | −8.274800E−13 | −2.776107E−07 |
| 14th order coefficient (E14) | 7.852351E−15 | 1.252620E−14 | 1.615320E−13 |
| 16th order coefficient (E16) | 2.855639E−17 | 7.065636E−17 | −3.215843E−16 |

| | Surface number | | |
|---|---|---|---|
| | 22 | 23 | 24 |
| 4th order coefficient (E4) | 8.609800E−05 | 2.515713E−05 | 2.590017E−05 |
| 6th order coefficient (E6) | 2.375690E−07 | −1.000793E−06 | −6.238096E−07 |
| 8th order coefficient (E8) | −1.629372E−08 | 8.705097E−09 | 1.014559E−08 |
| 10th order coefficient (E10) | 2.036335E−10 | −1.899131E−11 | −1.315813E−10 |
| 12th order coefficient (E12) | −6.003102E−13 | −8.301279E−14 | 1.169057E−12 |
| 14th order coefficient (E14) | −4.683342E−15 | −3.504498E−17 | −5.487696E−15 |
| 16th order coefficient (E16) | 3.675703E−17 | 2.511070E−18 | 1.055394E−17 |

A formula for calculating an aspheric surface by applying aspheric surface coefficients as described above thereto is expressed in Formula 1.

$$D = \frac{C \cdot H^2}{1 + \sqrt{1 - (1+K) \cdot C^2 \cdot H^2}} + E_4 \cdot H^4 + E_6 \cdot H^6 + E_8 \cdot H^8 + E_{10} \cdot H^{10} + \ldots \quad \text{(Formula 1)}$$

Coefficients for forming a reflection surface of a second mirror 10 are presented in Table 3.

TABLE 3

| | |
|---|---|
| C | 0 |
| K: Conic constant | 0 |
| C2: y | 0 |
| C3: x**2 | 5.866757E−03 |
| C4: y**2 | 2.318685E−03 |
| C5: x**2*y | 3.439305E−05 |
| C6: y**3 | 3.716809E−06 |
| C7: x**4 | 2.096684E−07 |
| C8: x**2*y**2 | 4.725012E−07 |
| C9: y**4 | 9.431793E−08 |
| C10: x**4*y | 3.970253E−09 |
| C11: x**2*y**3 | 5.751713E−09 |
| C12: y**5 | −1.826627E−09 |
| C13: x**6 | −1.214379E−10 |
| C14: x**4*y**2 | 7.999683E−12 |
| C15: x**2*y**4 | −1.080515E−10 |
| C16: y**6 | 1.569398E−10 |
| C17: x**6*y | −4.117673E−12 |
| C18: x**4*y**3 | −1.998693E−12 |
| C19: x**2*y**5 | 4.163005E−12 |
| C20: y**7 | −3.742220E−12 |
| C21: x**8 | 1.020483E−13 |
| C22: x**6*y**2 | −3.119203E−14 |
| C23: x**4*y**4 | 1.398034E−13 |
| C24: x**2*y**6 | −2.348514E−14 |
| C25: y**8 | −4.532417E−14 |
| C26: x**8*y | 3.112801E−15 |
| C27: x**6*y**3 | 2.784611E−15 |
| C28: x**4*y**5 | −1.128068E−15 |
| C29: x**2*y**7 | 3.398303E−15 |
| C30: y**9 | 2.408328E−15 |
| C31: x**10 | −4.869393E−17 |
| C32: x**8*y**2 | 5.954255E−17 |
| C33: x**6*y**4 | −8.527970E−18 |
| C34: x**4*y**6 | −2.256822E−16 |
| C35: x**2*y**8 | 5.986575E−18 |
| C36: y**10 | 1.649588E−17 |
| C37: x**10*y | −1.052684E−18 |
| C38: x**8*y**3 | −2.459156E−18 |
| C39: x**6*y**5 | −9.174022E−19 |
| C40: x**4*y**7 | 3.612815E−18 |
| C41: x**2*y**9 | −5.350218E−18 |
| C42: y**11 | −8.824203E−19 |
| C43: x**12 | 1.298263E−20 |
| C44: x**10*y**2 | −3.046637E−20 |
| C45: x**8*y**4 | −2.306291E−20 |
| C46: x**6*y**6 | 1.630150E−19 |
| C47: x**4*y**8 | 3.886851E−21 |
| C48: x**2*y**10 | 9.864038E−20 |
| C49: y**12 | −8.426835E−21 |
| C50: x**12*y | 1.460937E−22 |
| C51: x**10*y**3 | 1.095031E−21 |
| C52: x**8*y**5 | 5.236515E−22 |
| C53: x**6*y**7 | −3.033300E−21 |
| C54: x**4*y**9 | 1.637244E−21 |
| C55: x**2*y**11 | 2.495311E−22 |
| C56: y**13 | 4.066596E−22 |
| C57: x**14 | −1.461270E−24 |
| C58: x**12*y**2 | 5.275013E−24 |
| C59: x**10*y**4 | 4.335473E−24 |
| C60: x**8*y**6 | −2.725007E−23 |
| C61: x**6*y**8 | 2.048197E−24 |
| C62: x**4*y**10 | −4.990440E−23 |
| C63: x**2*y**12 | −1.759478E−23 |
| C64: y**14 | −3.611435E−24 |
| C65: x**14*y | −3.771134E−27 |
| C66: x**12*y**3 | −1.804780E−25 |
| C67: x**10*y**5 | 7.697891E−28 |
| C68: x**8*y**7 | 3.427100E−25 |
| C69: x**6*y**9 | 1.715807E−25 |
| C70: x**4*y**11 | 3.498456E−25 |
| C71: x**2*y**13 | 1.057061E−25 |
| C72: y**15 | 8.925445E−27 |

A formula for calculating a reflection surface of a second mirror 10 by applying coefficients as described above thereto is expressed in Formula 2.

$$z = \frac{cr^2}{1 + SQRT[1 - (1+k)c^2r^2]} + \sum_{j=2}^{72} c_j x^m y^n \quad \text{(Formula 2)}$$

Herein,
Z: an amount of sag of a plane parallel to a z-axis
C: a curvature at an apex (CUY)
K: a conic constant
$c_j$: a coefficient of a monomial formula of $x^m y^n$.

A layout of a first mirror 9, a second mirror 10, and a dust-proof glass is illustrated in Table 4.

TABLE 4

| A reference of a surface apex of a lens surface closest to a first mirror | | | | |
|---|---|---|---|---|
| | X | Y | Z | α |
| First mirror (plane mirror) | 0 | 0 | 59.7697 | −45 |
| Second mirror (concave mirror) | 0 | 55 | −5.5303 | −39.7 |
| Dust-proof glass first surface | 0 | 55 | 62.7697 | 0 |
| Dust-proof glass second surface | 0 | 55 | 65.7697 | 0 |
| Screen | 0 | −130 | | −90 |

According to a projector 100 having a configuration illustrated above, it may be possible to obtain an image displaying apparatus capable of displaying a large format image in spite of an ultra-short throw.

Additionally, in Table 3, "**" indicates an exponentiation operation. Furthermore, "*" indicates multiplication.

As described above, it may be possible for an image displaying apparatus according to an embodiment of the present invention to adjust a position of a first mirror to cancel a dispersion provided when a dispersion is provided to a positional relationship between a second mirror and a lens optical system, whereby it may be possible to improve a quality of a displayed image.

APPENDIX

An Illustrative Embodiment(s) of an Image Displaying Apparatus

At least one illustrative embodiment of the present invention may relate to an image displaying apparatus for projecting onto and displaying on a screen an enlarged image.

An object of at least one illustrative embodiment of the present invention may be to provide an image displaying apparatus with a vertical-type projection optical system, wherein it may be possible for the image displaying apparatus to prevent degradation of a quality of a projection image due to a positional error of an optical system.

At least one illustrative embodiment of the present invention may be an image displaying apparatus which is principally characterized by including an illumination optical system for irradiating an image displaying element with light emitted from a light source, the image displaying element for forming a projection image by illumination light from the illumination optical system, and a projection optical system totally having a positive power to project a projection image formed by the image displaying element onto a surface to be projected to, wherein the projection optical system includes a lens optical system composed of plural lens groups and a mirror optical system including a first mirror and a second mirror which is a concave mirror, wherein an intermediate image of a pixel for the image displaying element is formed between the image displaying element and the second mirror, wherein an angle of the image displaying element with respect to the surface to be projected to is generally a right angle, and wherein the first mirror is held to be capable of adjusting a position thereof.

Illustrative embodiment (1) is an image displaying apparatus including an illumination optical system for illuminating an image displaying element with light emitted from a light source, the image displaying element for forming a projection image by illumination light from the illumination optical system, and a projection optical system totally having a positive refractive power to project a projection image formed by the image displaying element onto a surface to be projected to, wherein the image displaying apparatus is characterized in that the projection optical system includes a lens optical system composed of plural lens groups and a mirror optical system including a first mirror and a second mirror being a concave mirror, wherein an intermediate image of a pixel for the image displaying element is formed between the image displaying element and the second mirror, wherein an angle of the image displaying element with respect to the surface to be projected to is generally a right angle, and wherein the first mirror is held to be capable of adjusting a position thereof.

Illustrative embodiment (2) is the image displaying apparatus as described in Illustrative embodiment (1), characterized in that the first mirror is a plane mirror.

Illustrative embodiment (3) is the image displaying apparatus as described in Illustrative embodiment (1), characterized in that the first mirror is held at a predetermined position via a position adjusting part and the position adjusting part includes three fixation members for supporting the first mirror at three points, three fastening members for fixing the three fixation members on a back supporting part provided in the image displaying apparatus, and three spacers inserted between a back face of the first mirror and the back supporting part, wherein a position of the first mirror is adjusted by a thickness of each of the spacers.

Illustrative embodiment (4) is the image displaying apparatus as described in Illustrative embodiment (3), characterized in that a thickness of each of the spacers is identical thereto and the first mirror is held to be capable of adjusting a position thereof in a direction perpendicular to a reflection surface thereof.

Illustrative embodiment (5) is the image displaying apparatus as described in Illustrative embodiment (3), characterized in that thicknesses of the spacers are different from one another and the first mirror is held to be capable of adjusting a tilt of a reflection surface thereof.

Illustrative embodiment (6) is the image displaying apparatus as described in any of Illustrative embodiments (1) to (5), characterized in that the second mirror is a free-form surface mirror.

Illustrative embodiment (7) is the image displaying apparatus as described in any of Illustrative embodiments (1) to (6), characterized in that the image displaying element is a reflective image displaying element having plural micro-mirrors arranged two-dimensionally to change a tilt angle of an individual micro-mirror between an on-state and an off-state so that emission of reflected light is turned on or off.

According to at least one illustrative embodiment of the present invention, it may be possible to obtain an image displaying apparatus wherein it may be possible to prevent degradation of an image quality of a projection image due to a positional error of an optical system and display a large format image on a screen at a short distance.

Although the illustrative embodiment(s) and specific example(s) of the present invention have been described with reference to the accompanying drawings, the present invention is not limited to any of the illustrative embodiment(s) and specific example(s) and the illustrative embodiment(s) and specific example(s) may be altered, modified, or combined without departing from the scope of the present invention.

The present application claims the benefit of priority based on Japanese Patent Application No. 2011-238812 filed on Oct. 31, 2011, the entire content of which is hereby incorporated by reference herein.

What is claimed is:

1. An image displaying apparatus comprising:
   an image displaying element configured to form an image to be projected; and
   a projection optical system having a positive refractive power and configured to project the image to be projected onto a screen,
   wherein the projection optical system includes a lens optical system and a mirror optical system, the lens optical system including plural lens groups, the mirror optical system including a first mirror and a second mirror, the second mirror being a concave mirror,
   wherein an intermediate image of a pixel of the image displaying element is formed between the image displaying element and the second mirror,
   wherein the first mirror is held by a position adjusting part which adjusts a position thereof, the position adjusting part including a plurality of spacers which are inserted between a back face of the first mirror and a back supporting part, the position of the first mirror being adjusted by a thickness of each of the spacers, and
   wherein the thickness of each of the spacers is identical thereto and the first mirror is held to be capable of adjusting the position thereof in a direction perpendicular to a reflection surface thereof.

2. The image displaying apparatus as claimed in claim 1, wherein an angle of the image displaying element with respect to the screen is approximately a right angle.

3. The image displaying apparatus as claimed in claim 1, wherein the first mirror is a plane mirror.

4. The image displaying apparatus as claimed in claim 1, wherein the position adjusting part includes three fixation members configured to support the first mirror at three points and three fastening members configured to fix the three fixation members on the back supporting part.

5. The image displaying apparatus as claimed in claim 1, wherein the second mirror is a free-form surface mirror.

6. The image displaying apparatus as claimed in claim 1, wherein the image displaying element is a reflective image displaying element having plural micro-mirrors arranged two-dimensionally and being capable of changing a tilt angle of each of the micro-mirrors between an on-state and an off-state to turn on or off reflection of light therefrom.

7. An image displaying apparatus comprising:
   an image displaying element configured to form an image to be projected; and
   a projection optical system having a positive refractive power and configured to project the image to be projected onto a screen,
   wherein the projection optical system includes a lens optical system and a mirror optical system, the lens optical system including plural lens groups, the mirror optical system including a first mirror and a second mirror, the second mirror being a concave mirror, wherein an intermediate image of a pixel of the image displaying element is formed between the image displaying element and the second mirror, wherein the first mirror is held by a position adjusting part which adjusts a position thereof, the position adjusting part including a plurality of spacers which are inserted between a back face of the first mirror and a back supporting part, the position of the first mirror being adjusted by a thickness of each of the spacers, and wherein the thicknesses of the spacers are different from one another and the first mirror is held to be capable of adjusting a tilt of a reflection surface thereof.

8. The image displaying apparatus as claimed in claim 7, wherein an angle of the image displaying element with respect to the screen is approximately a right angle.

9. The image displaying apparatus as claimed in claim 7, wherein the first mirror is a plane mirror.

10. The image displaying apparatus as claimed in claim 7, wherein the position adjusting part includes three fixation members configured to support the first mirror at three points and three fastening members configured to fix the three fixation members on the back supporting part.

11. The image displaying apparatus as claimed in claim 7, wherein the second mirror is a free-form surface mirror.

12. The image displaying apparatus as claimed in claim 7, wherein the image displaying element is a reflective image displaying element having plural micro-mirrors arranged two-dimensionally and being capable of changing a tilt angle of each of the micro-mirrors between an on-state and an off-state to turn on or off reflection of light therefrom.

13. An image displaying apparatus comprising:
   an image displaying element configured to form an image to be projected; and
   a projection optical system having a positive refractive power and configured to project the image to be projected onto a screen,
   wherein the projection optical system includes a lens optical system and a mirror optical system, the lens optical system including plural lens groups, the mirror optical system including a first mirror and a second mirror, the second mirror being a concave mirror,
   wherein an intermediate image of a pixel of the image displaying element is formed between the image displaying element and the second mirror,
   wherein the first mirror is held by a position adjusting part which adjusts a position thereof, the position adjusting part including a spacer which is inserted between a back face of the first mirror and a back supporting part, the position of the first mirror being adjusted by a thickness of the spacer, and
   wherein the position adjusting part includes a fastening member configured to fix the first mirror and the spacer on the back supporting part, the fastening member passing through the first mirror and the spacer.

14. The image displaying apparatus as claimed in claim 13, wherein an angle of the image displaying element with respect to the screen is approximately a right angle.

15. The image displaying apparatus as claimed in claim 13, wherein the first mirror is a plane mirror.

16. The image displaying apparatus as claimed in claim 13, wherein the second mirror is a free-form surface mirror.

17. The image displaying apparatus as claimed in claim 13, wherein the image displaying element is a reflective image displaying element having plural micro-mirrors arranged two-dimensionally and being capable of changing a tilt angle of each of the micro-mirrors between an on-state and an off-state to turn on or off reflection of light therefrom.

* * * * *